United States Patent
Sahara et al.

(10) Patent No.: US 9,219,392 B2
(45) Date of Patent: Dec. 22, 2015

(54) BRUSHLESS MOTOR

(71) Applicant: ASMO CO., LTD., Kosai, Shizuoka-pref. (JP)

(72) Inventors: Yoshimichi Sahara, Toyohashi (JP); Akio Murase, Toyohashi (JP)

(73) Assignee: ASMO CO., LTD., Kosai (JP)

( * ) Notice: Subject to any disclaimer, the term of this patent is extended or adjusted under 35 U.S.C. 154(b) by 230 days.

(21) Appl. No.: 13/956,353

(22) Filed: Aug. 1, 2013

(65) Prior Publication Data

US 2014/0042848 A1 Feb. 13, 2014

(30) Foreign Application Priority Data

Aug. 9, 2012 (JP) .................................. 2012-177244

(51) Int. Cl.
| | |
|---|---|
| *H02K 5/10* | (2006.01) |
| *H02K 5/16* | (2006.01) |
| *H02K 5/173* | (2006.01) |
| *H05K 1/18* | (2006.01) |

(52) U.S. Cl.
CPC .. *H02K 5/10* (2013.01); *H02K 5/16* (2013.01); *H02K 5/1737* (2013.01); *H05K 1/187* (2013.01)

(58) Field of Classification Search
CPC .................................. H02K 5/16; H02K 5/10
USPC ............. 310/156.01, 89–91, 52, 53, 401, 402
See application file for complete search history.

(56) References Cited

U.S. PATENT DOCUMENTS

| | | | | |
|---|---|---|---|---|
| 4,757,222 | A * | 7/1988 | Shiraki .................. | H02K 29/08 310/138 |
| 5,412,272 | A * | 5/1995 | Mensching ...................... | 310/88 |
| 7,420,304 | B2 * | 9/2008 | Sugiyama et al. .............. | 310/90 |
| 7,800,267 | B2 * | 9/2010 | Sahara et al. ................... | 310/90 |
| 7,859,155 | B2 | 12/2010 | Sahara et al. | |
| 2010/0320851 | A1 * | 12/2010 | Lambka et al. ................. | 310/54 |

FOREIGN PATENT DOCUMENTS

JP   2009-148056 A   7/2009

* cited by examiner

*Primary Examiner* — Terrance Kenerly
*Assistant Examiner* — Alexander Singh
(74) *Attorney, Agent, or Firm* — SOLARIS Intellectual Property Group, PLLC

(57) ABSTRACT

A brushless motor is provided including: a rotor housing including a circular-cylinder-shaped bearing housing portion and an outer cylinder portion; a rotor magnet provided at an inner peripheral face of the outer cylinder portion; a bearing housed in the bearing housing portion and assembled to a motor shaft; a stator core including a ring-shaped core main body provided in the radial direction between the bearing housing portion and the rotor magnet and a ring-shaped wall portion formed in a ring-shape along an inner peripheral portion of the core main body, extending from the core main body inner peripheral portion towards the radial direction inside, and facing one opening of the bearing housing portion; and a center piece including a main body portion facing one opening of the outer cylinder portion, and a close contact portion closely contacting in the stator core axial direction with the ring-shaped wall portion.

2 Claims, 1 Drawing Sheet

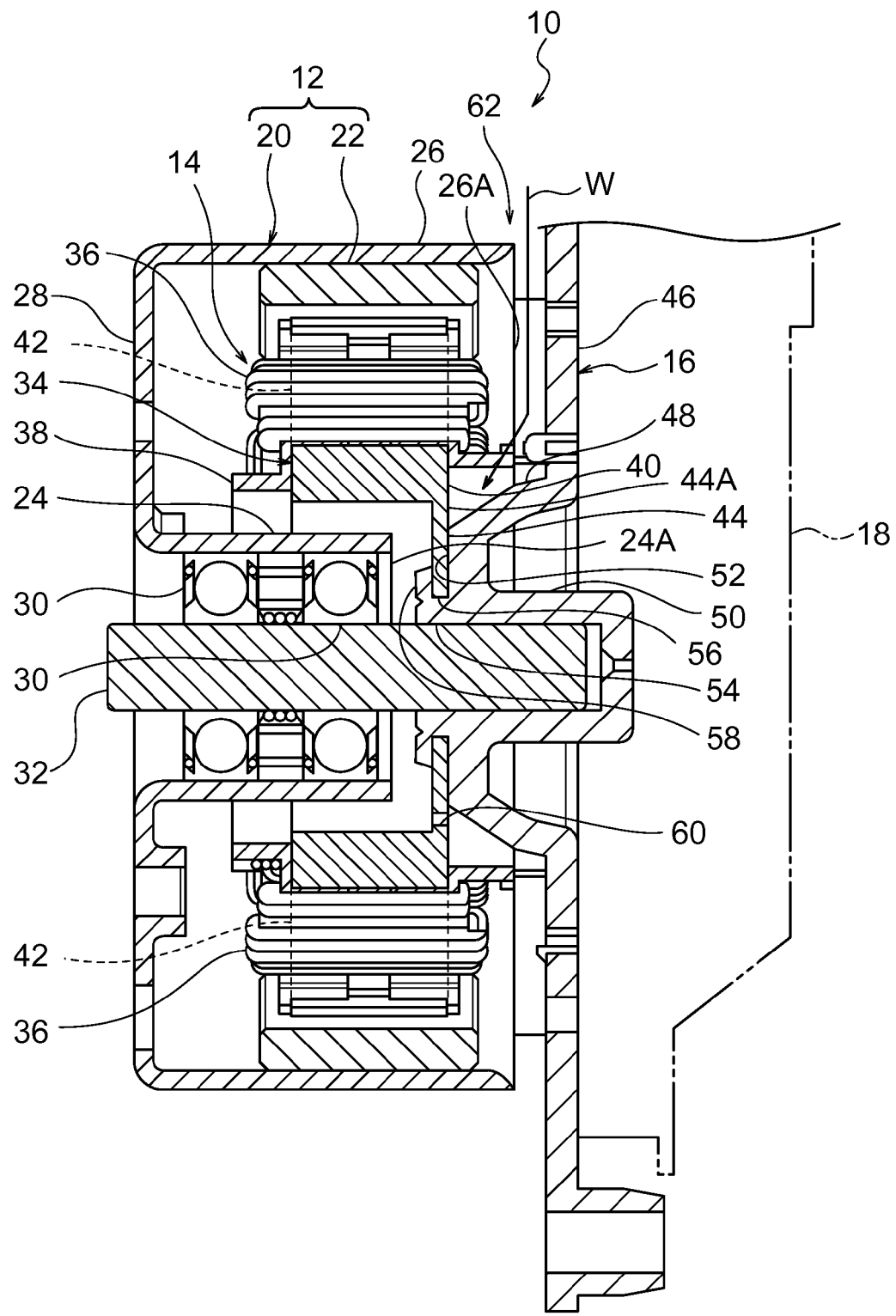

BRUSHLESS MOTOR

CROSS-REFERENCE TO RELATED APPLICATION

This application claims priority under 35 USC 119 from Japanese Patent Application No. 2012-177244, filed Aug. 9, 2012 the disclosure of which is incorporated by reference herein.

BACKGROUND OF THE INVENTION

1. Field of the Invention

The present invention relates to a brushless motor.

2. Related Art

A known outer rotor type brushless motor includes a rotor housing formed in a bottomed cylinder shape, a center piece that faces an opening of the rotor housing, and a ring shaped stator core that is press-fitted into the outside of a cylinder shaped portion formed to the center piece and that is housed inside the rotor housing (see for example Japanese Patent Application Laid-Open (JP-A) No. 2009-148056).

In such as brushless motor, in a case in which the center piece and the stator core are formed from different materials to each other, there is a concern of a gap being formed in the radial direction between the cylinder shaped portion of the center piece and the stator core due to their different linear expansion coefficients. In particular, since shrinkage of the stator core and the center piece occurs mainly in the radial direction, a gap is easily formed with even a small amount of shrinkage.

In a case in which a gap has formed in the radial direction between the cylinder portion of the center piece and the stator core, there is a concern of water that has entered through an axial direction gap between the rotor housing and the center piece passing through the gap that has formed in the radial direction between the cylinder shaped portion and the stator core, and penetrating through to inside a bearing housing portion at a central portion of the rotor housing. When this occurs, there is a concern of a bearing housed inside the bearing housing portion being exposed to water, leading to rusting of the bearing.

SUMMARY OF THE INVENTION

In consideration of the above circumstances, the present invention is to provide a brushless motor capable of suppressing rusting of a bearing.

In order to address the above issues, a brushless motor of a first aspect includes: a rotor housing that includes a circular cylinder shaped bearing housing portion, and an outer cylinder portion that is formed at an outside in a radial direction of the bearing housing portion; a rotor magnet that is provided at an inner peripheral face of the outer cylinder portion; a bearing that is housed in the bearing housing portion and assembled to a motor shaft; a stator core that includes a ring shaped core main body that is provided in the radial direction between the bearing housing portion and the rotor magnet, and a ring shaped wall portion that is formed in a ring shape along an inner peripheral portion of the core main body, that extends from the inner peripheral portion of the core main body towards an inside in the radial direction, and that faces one opening of the bearing housing portion; and a center piece that includes a main body portion that faces one opening of the outer cylinder portion, and a close contact portion that is in close contact with the ring shaped wall portion in an axial direction of the stator core.

According to this brushless motor, at the stator core, the ring shaped wall portion is formed that is formed in a ring shape along the inner peripheral portion of the core main body, and extending from the core main body inner peripheral portion towards the radial direction inside. The ring shaped wall portion faces the one opening of the bearing housing portion. At the center piece, the close contact portion is formed, the close contact portion is in closely contact in the stator core axial direction with the ring shaped wall. Accordingly, a gap can be suppressed from forming between the ring shaped wall portion and the close contact portion even in a case in which for example the stator core and the center piece undergo thermal contraction (shrinkage) (in particular in a case of contraction mainly in the radial direction). Water can accordingly be suppressed from entering inside the bearing housing portion even in a case in which water has entered from an axial direction gap between the rotor housing and the center piece, thereby enabling rusting of the bearing to be suppressed.

A brushless motor of a second aspect is the brushless motor of the first aspect, wherein: the center piece includes a projection portion that projects out from the close contact portion through an inner hole of the ring shaped wall portion towards the one opening of the bearing housing portion; and a caulked portion is formed at a leading end of the projection portion, the caulked portion spreading out towards an outside in a radial direction of the inner hole such that the ring shaped wall portion is in close contact with the close contact portion by being caulked.

According to this brushless motor, the center piece is formed with the projection portion that projects from the close contact portion through the inner hole of the ring shaped wall portion towards the one opening of the bearing housing portion. The leading end of the projection portion is caulked to form the caulked portion that spreads out towards the inner hole radial direction outside, the caulked portion placing the ring shaped wall portion in close contact with the close contact portion. Accordingly, during an assembly process of the brushless motor, the ring shaped wall portion can easily be placed in close contact with the close contact portion, and the ring shaped wall portion can be maintained in a close contact state with the close contact portion even after assembling of the brushless motor.

A brushless motor of a third aspect is the brushless motor of either the first aspect or the second aspect, wherein: an outer edge portion of the ring shaped wall portion is positioned (located) further to the outside in the radial direction than the close contact portion; and a through hole is formed at a location of the outer edge portion of the ring shaped wall portion, which location is positioned at a lower side in a vertical direction in an installed state of the brushless motor.

According to this brushless motor, the through hole is formed at the location of the outer edge portion of the ring shaped wall portion, the location being positioned at the vertical direction lower side in an installed state of the brushless motor. Water can accordingly be expelled through the through hole even if water has entered inside the core main body.

BRIEF DESCRIPTION OF THE DRAWINGS

An embodiment of the invention will be described in detail with reference to the following FIGURE, wherein FIG. 1 is a vertical cross-section of a brushless motor according to an exemplary embodiment of the present invention.

DETAILED DESCRIPTION OF THE INVENTION

Explanation follows regarding an exemplary embodiment of the present invention with reference to the drawing.

As illustrated in FIG. 1, a brushless motor 10 according to an exemplary embodiment of the present invention includes a rotor 12, a stator 14, a center piece 16 and a control unit 18.

The rotor 12 is provided with a rotor housing 20 and a rotor magnet 22. The rotor housing 20 includes a circular cylinder shaped bearing (shaft receiving portion) housing portion 24, and an outer cylinder portion 26 formed at the radial direction outside of the bearing housing portion 24. End portions of the bearing housing portion 24 and the outer cylinder portion 26 at an opposite side to the center piece 16 are coupled by a bottom wall portion 28. A pair of bearings (shaft receiving portions) 30 are housed in the bearing housing portion 24, and a motor shaft 32 is assembled to the pair of bearings 30. The rotor magnets 22 are provided at an inner peripheral face of the outer cylinder portion 26.

The stator 14 is provided with a stator core 34, plural coil wires 36, and an insulator 38. The stator core 34 includes a ring shaped core main body 40. The core main body 40 is provided in the radial direction between the bearing housing portion 24 and the rotor magnet 22. The core main body 40 includes plural teeth portions 42 that extend in a radial pattern. The insulator 38 is mounted to the core main body 40, and each of the coil wires 36 is wound around the respective teeth portion 42 via the insulator 38.

A ring shaped wall portion 44 is formed at the stator core 34. The ring shaped wall portion 44 is formed in a ring shape along an inner peripheral portion of the core main body 40 and extending from the inner peripheral portion of the core main body 40 towards the radial direction inside. The ring shaped wall portion 44 faces one of openings 24A of the bearing housing portion 24.

The center piece 16 is for example made of an aluminum alloy. The center piece 16 includes a circular plate shaped main body portion 46. The main body portion 46 faces one of openings 26A in the outer cylinder portion 26, with the control unit 18 supported on the main body portion 46. A protruding (bulge) portion 48 that protrudes towards the bearing housing portion 24 side is formed to the main body portion 46, and a shaft support portion 50 is formed at a central portion of the protruding portion 48. The shaft support portion 50 is formed with a recessed (concave) shape that is recessed towards the opposite side to the bearing housing portion 24. One end side of the motor shaft 32 (a portion on the opposite side to the side supported by the bearing 30) is housed (press fitted into) and supported by the shaft support portion 50.

A wall portion at a leading end of the protruding portion 48 forms a close contact portion 52. The close contact portion 52 makes closely (tight) contact with the ring shaped wall portion 44 in an axial direction of the stator core 34 axial direction. A projection portion 54 is formed at a central portion of the close contact portion 52. The projection portion 54 projects out from a central portion of the close contact portion 52, penetrating through an inner hole 56 of the ring shaped wall portion 44, towards the one opening 24A in the bearing housing portion 24. A leading end of the projection portion 54 is caulked so as to form a caulked portion 58 that spreads out towards an radial direction outside of the inner hole 56. The ring shaped wall portion 44 mentioned above is pressed and pushed by the caulked portion 58, thereby placing the ring shaped wall portion 44 in close contact with the close contact portion 52.

An outer edge portion 44A (an portion at the radial direction outside) of the ring shaped wall portion 44 is positioned (located) further to the radial direction outside than the close contact portion 52. A through hole 60 is formed at a location of the outer edge portion 44A of the ring shaped wall portion 44, which location is positioned at the vertical direction lower side in an installed state of the brushless motor 10. Note that in the present exemplary embodiment, by way of an example, the brushless motor 10 is installed such that the motor shaft 32 is horizontal and the through hole 60 is positioned at the vertical direction lower side.

Explanation follows regarding operation and advantageous effects of the exemplary embodiment of the present invention.

As described above, according to the brushless motor 10 of an exemplary embodiment of the present invention, the stator core 34 is formed with the ring shaped wall portion 44 which is formed in a ring shape which is along the inner peripheral portion of the core main body 40 and which extends from the inner peripheral portion of the core main body 40 towards the radial direction inside. The ring shaped wall portion 44 faces the one opening 24A of the bearing housing portion 24. Moreover, the center piece 16 is formed with the close contact portion 52, and the close contact portion 52 in closely contact with the ring shaped wall portion 44 in the stator core 34 axial direction. Accordingly, a gap can be suppressed from forming between the ring shaped wall portion 44 and the close contact portion 52 even when for example the stator core 34 and the center piece 16 undergo thermal contraction (in particular contraction mainly in the radial direction). Water can accordingly be suppressed from entering in the bearing housing portion 24 even if water W has entered through an axial direction gap 62 between the rotor housing 20 and the center piece 16, thereby enabling rusting of the bearings 30 to be suppressed.

The center piece 16 is moreover formed with the projection portion 54 that protrudes out from the central portion of the close contact portion 52 through the inner hole 56 of the ring shaped wall portion 44 towards the one opening 24A in the bearing housing portion 24. The leading end of the projection portion 54 is caulked so as to form the caulked portion 58 that spreads out towards the inner hole 56 radial direction outside. The ring shaped wall portion 44 and the close contact portion 52 are placed in close contact by the caulked portion 58. Accordingly, during an assembly process of the brushless motor 10, the ring shaped wall portion 44 can easily be placed in close contact with the close contact portion 52, and the ring shaped wall portion 44 can be maintained in a closely contact state with the close contact portion 52 even after assembling of the brushless motor 10.

In particular, as described above the stator core 34 is fixed to the center piece 16 by the closely contact between the ring shaped wall portion 44 and the close contact portion 52 by the caulked portion 58. The stator core 34 can accordingly be suppressed from coming off from the center piece 16 even when the stator core 34 and the center piece 16 undergo thermal contraction (in particular contraction mainly in the radial direction).

The through hole 60 is formed at a location of the outer edge portion 44A of the ring shaped wall portion 44 which location is positioned at the vertical direction lower side in the installed state of the brushless motor 10. Water can accordingly be expelled through the through hole 60 even when water has entered inside the core main body 40.

Explanation follows regarding modified examples of an exemplary embodiment of the present invention.

In the exemplary embodiment of the present invention described above, the center piece 16 is configured from an aluminum alloy by way of example, however the center piece 16 may also be configured from another metal or a resin having good thermal conductivity.

Moreover, the ring shaped wall portion 44 is placed in close contact with the close contact portion 52 by being press-pushed by the caulked portion 58, however, the ring shaped wall portion 44 may be fixed in a closely contact state with the close contact portion 52 by for example another fastening member or by a rivet.

The close contact portion 52 is formed in a wall shape, however this does not have to be formed in the wall shape.

The brushless motor 10 is installed such that the motor shaft 32 is along the horizontal direction, however the brushless motor 10 may be installed with the motor shaft 32 being inclined with respect to the horizontal direction, or the brushless motor 10 may be installed with the motor shaft 32 being along in the vertical direction.

Explanation has been given above of an exemplary embodiment of the present invention, however the present invention is not limited to the above, and obviously various modifications other than those described above may be implemented within a range not departing from the scope of the present invention.

What is claimed is:

1. A brushless motor comprising:
    a rotor housing that includes a circular cylinder shaped bearing housing portion, and an outer cylinder portion that is formed at an outside in a radial direction of the bearing housing portion;
    a rotor magnet that is provided at an inner peripheral face of the outer cylinder portion;
    a bearing that is housed in the bearing housing portion and assembled to a motor shaft;
    a stator core that includes a ring shaped core main body that is provided in the radial direction between the bearing housing portion and the rotor magnet, and a ring shaped wall portion, formed at the stator core, that is formed in a ring shape along an inner peripheral portion of the core main body, that extends from the inner peripheral portion of the core main body towards an inside in the radial direction, and that faces one opening of the bearing housing portion; and
    a center piece that includes a main body portion that faces one opening of the outer cylinder portion, and a close contact portion that is in close contact with the ring shaped wall portion in an axial direction of the stator core;
    wherein
    the center piece includes a projection portion formed thereat, that projects out from the close contact portion through an inner hole of the ring shaped wall portion towards the one opening of the bearing housing portion; and
    a leading end of the projection portion spreads out towards an outer side further than the inner hole in a radial direction of the inner hole such that the ring shaped wall portion is in close contact with the close contact portion.

2. The brushless motor of claim 1, wherein:
    an outer edge portion of the ring shaped wall portion is positioned further to the outside in the radial direction than the close contact portion; and
    a through hole is formed at a location of the outer edge portion of the ring shaped wall portion, which location is positioned at a lower side in a vertical direction in an installed state of the brushless motor.

* * * * *